US006178086B1

(12) United States Patent
Sim et al.

(10) Patent No.: US 6,178,086 B1
(45) Date of Patent: Jan. 23, 2001

(54) APPARATUS AND METHOD FOR SECURING A REMOVABLE COMPONENT IN A COMPUTER SYSTEM

(75) Inventors: Vibora Sim, Pflugerville; Ty Robert Schmitt, Round Rock, both of TX (US)

(73) Assignee: Dell USA, L.P., Round Rock, TX (US)

( * ) Notice: Under 35 U.S.C. 154(b), the term of this patent shall be extended for 0 days.

(21) Appl. No.: 09/290,976

(22) Filed: Apr. 13, 1999

(51) Int. Cl.[7] ...................................................... G06F 1/16
(52) U.S. Cl. ........................ 361/683; 361/726; 312/223.2
(58) Field of Search ................................... 361/683, 685, 361/725, 726; 312/223.2–223.6; 248/917; 345/169, 905

(56) References Cited

U.S. PATENT DOCUMENTS

| 5,020,926 | * | 6/1991 | Wilhelm | 361/391 |
| 5,264,986 | * | 11/1993 | Ohgami et al. | 361/685 |
| 5,321,962 | | 6/1994 | Ferchau et al. | 361/726 |
| 5,325,263 | | 6/1994 | Singer et al. | 361/683 |
| 5,761,045 | | 6/1998 | Olson et al. | 361/726 |
| 5,777,848 | | 6/1998 | McAnally et al. | 361/725 |
| 5,790,372 | | 8/1998 | Dewey et al. | 361/683 |
| 5,878,271 | * | 3/1999 | Crump et al. | 395/821 |
| 5,896,273 | * | 4/1999 | Varghese et al. | 361/724 |
| 6,055,152 | * | 4/2000 | Feleman et al. | 361/725 |

* cited by examiner

Primary Examiner—Leo P. Picard
Assistant Examiner—Hung Van Duong
(74) Attorney, Agent, or Firm—Haynes and Boone, L.L.P.

(57) ABSTRACT

An apparatus for securing a removable component in a computer system includes a chassis for receiving the removable component. A resilient member is connected to the component and a handle is also connected to the component. The handle is movable to an open position and to a closed position. A catch is formed on the handle and the catch is engaged by the resilient member on the chassis to retain the handle in the closed position. A release member is connected to the handle. The release member is movable to deflect the resilient member so that the resilient member is disengaged from the catch to permit the handle to be moved to the open position.

28 Claims, 5 Drawing Sheets

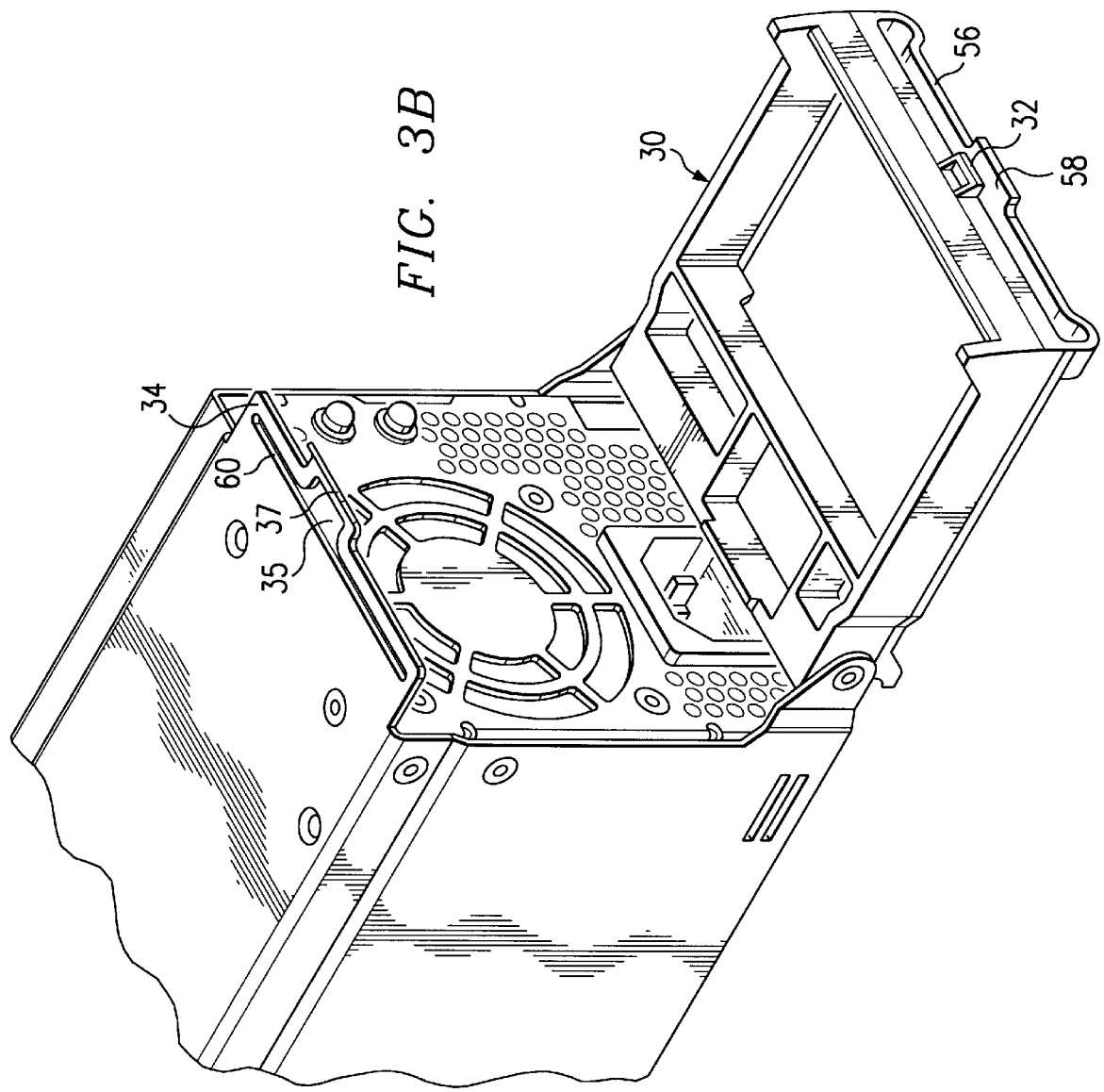

APPARATUS AND METHOD FOR SECURING A REMOVABLE COMPONENT IN A COMPUTER SYSTEM

BACKGROUND

The disclosures herein relate generally to computer systems and more particularly to apparatus and methods for securing removable components in a computer system.

Handles are used to aid in the insertion and extraction of removable components into and out of the chassis of a computer system. The handle may include a latching mechanism for securing the removable component in the chassis. It is desirable that the latching mechanism not unintentionally become unlatched during use.

It is also desirable that the handle have a geometry that does not adversely affect the flow of air to the removable component. This is particularly important for handles used in conjunction with removable components such as the power supply. The airflow through the power supply needs to be sufficient to preclude overheating or operation at undesirable elevated temperatures. For this reason, the handle should be configured to allow for airflow that is not significantly restricted by the handle and latching mechanism.

However, the size of computer systems continues to decrease and their complexity continues to increase. As a result, it has become necessary to mount the components in very close proximity to each other. In many cases, there is little room between adjacent components for manipulation of the handle or latching mechanism by the operator's hand or fingers. This is common in computer systems having a rack-type mounting configuration as well as in computer systems having redundant components that are mounted in close proximity to each other. In these instances, it is preferred that the handle and latching mechanism he manipulated from within the perimeter of the front or rear face of the removable component.

Accordingly, a need has arisen for an apparatus that is configured to overcome the shortcomings of prior art and, in particular, an apparatus for the insertion and extraction of the removable component which can be manipulated from within the perimeter of the front or rear face of the removable component and which does not significantly restrict airflow through the removable component.

SUMMARY

One embodiment, accordingly, provides an apparatus for fixedly securing a removable component in a computer system. The apparatus is further configured to include a handle that can be fixedly retained in a closed position or moved to an open position. To this end, an apparatus for securing a removable component in a computer system includes a chassis for receiving the removable component. A handle is connected to the component and is movable between open and closed positions. A catch is provided on the handle. A resilient member is connected to the chassis for engagement with the catch to retain the handle in the closed position. A release member is connected to the handle. The release member is movable to deflect the resilient member so that the resilient member is disengaged from the catch to permit the handle to be moved to the open position.

Several advantages are achieved by an apparatus according to the illustrative embodiments presented herein. The apparatus provides for a handle that exhibits reduced airflow restriction through a removable component in a computer system. The reduction in the airflow restriction allows the removable component to be cooled more effectively and efficiently. Reduced space is required for hand manipulation of the apparatus. The removable component having the handle and any adjacent removable components can be more easily inserted and extracted from the computer system. Furthermore, the reduced space requirement allows the removable components in the computer system to be positioned more closely together.

BRIEF DESCRIPTION OF THE DRAWING FIGURES

FIGS. 3A and 3B is a fragmentary perspective views illustrating an embodiment of a latching assembly in combination with a power supply, the handle of the latching assembly being in the open position.

DETAILED DESCRIPTION

Figure 1:
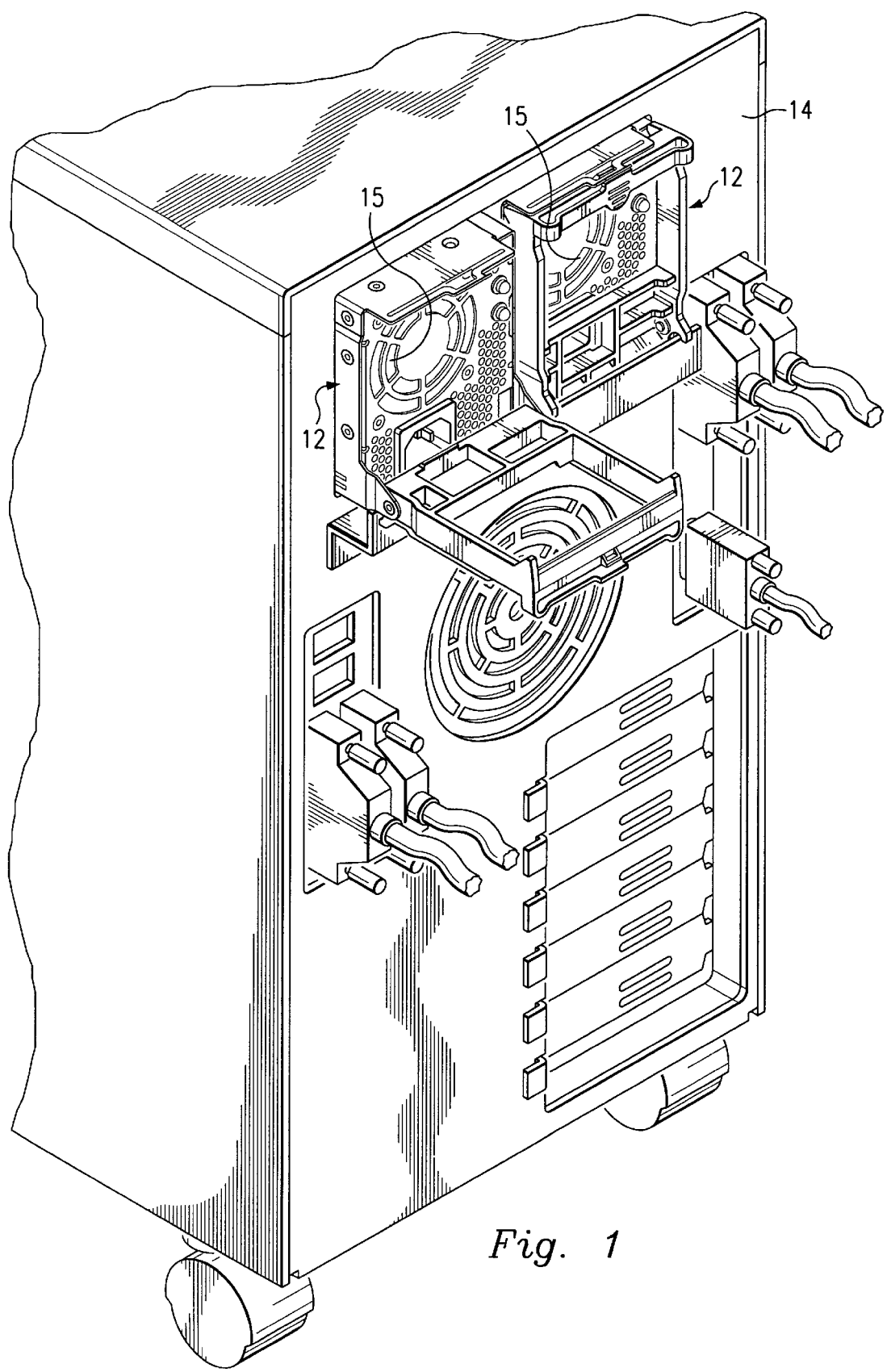
FIG. 1 is a partially fragmentary perspective view illustrating an embodiment of a computer system.
Figure 2:
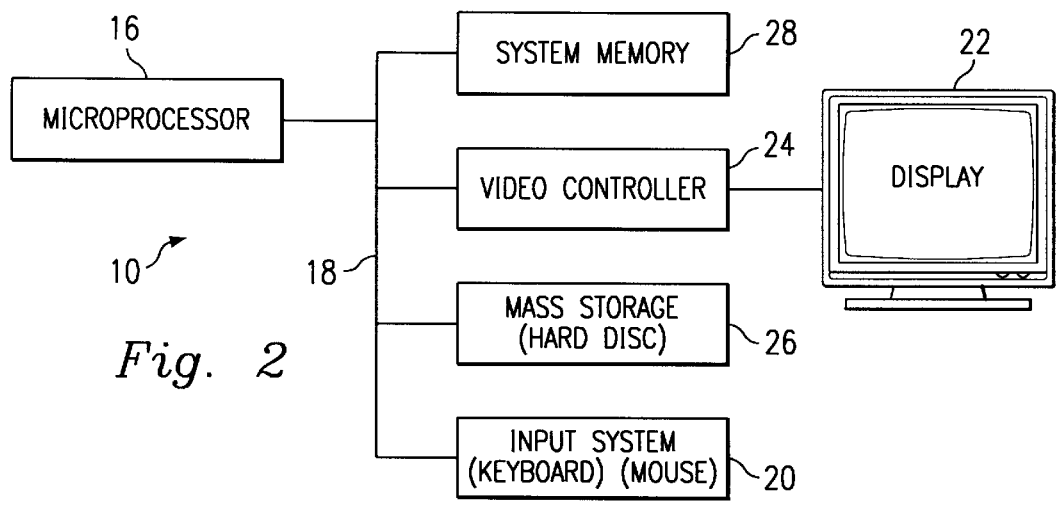
FIG. 2 is a block diagram illustrating an embodiment of a computer system.

FIGS. 1 and 2 show an illustrative embodiment of a computer system having two components 12 removably mounted in a chassis 14. The components 12 can be items such as power supplies, data storage devices, or other types of system components for a computer system. Each component 12 may include a fan vent 15 and fan (not shown) for providing air circulation through each component 12.

In the case of multiple components 12, they may be different components or the same. In host-type devices such as servers and workstations, it is sometimes desirable to have redundant components to limit down-time. One of the redundant components can be removed for servicing or replacement while the other is still in operation.

In one embodiment, as shown in FIG. 2, a computer system indicated generally at 10 includes a microprocessor 16. The microprocessor 16 is connected to a bus 18. The bus 18 serves as a connection between the microprocessor 16 and other components of the computer system 10. An input system 20 is coupled to the microprocessor 16 to provide input to the microprocessor 16. Examples of input systems include keyboards, touchscreens, and pointing devices such as a mouse, a trackball and a trackpad. The computer system 10 further includes a display 22 which is coupled to the microprocessor 16 typically by a video controller 24. Programs and data are stored on a mass storage device 26 which is coupled to the microprocessor 16. Mass storage devices include components such as hard disks, optical disks, magneto-optical drives, floppy drives, and the like. The system memory 28 provides the microprocessor 16 with fast storage to facilitate execution of computer programs by the microprocessor 16. It should be understood that other busses and intermediate circuits can be employed between the components described above and microprocessor 16 to facilitate interconnection between the components and the microprocessor.

Figure 3A:
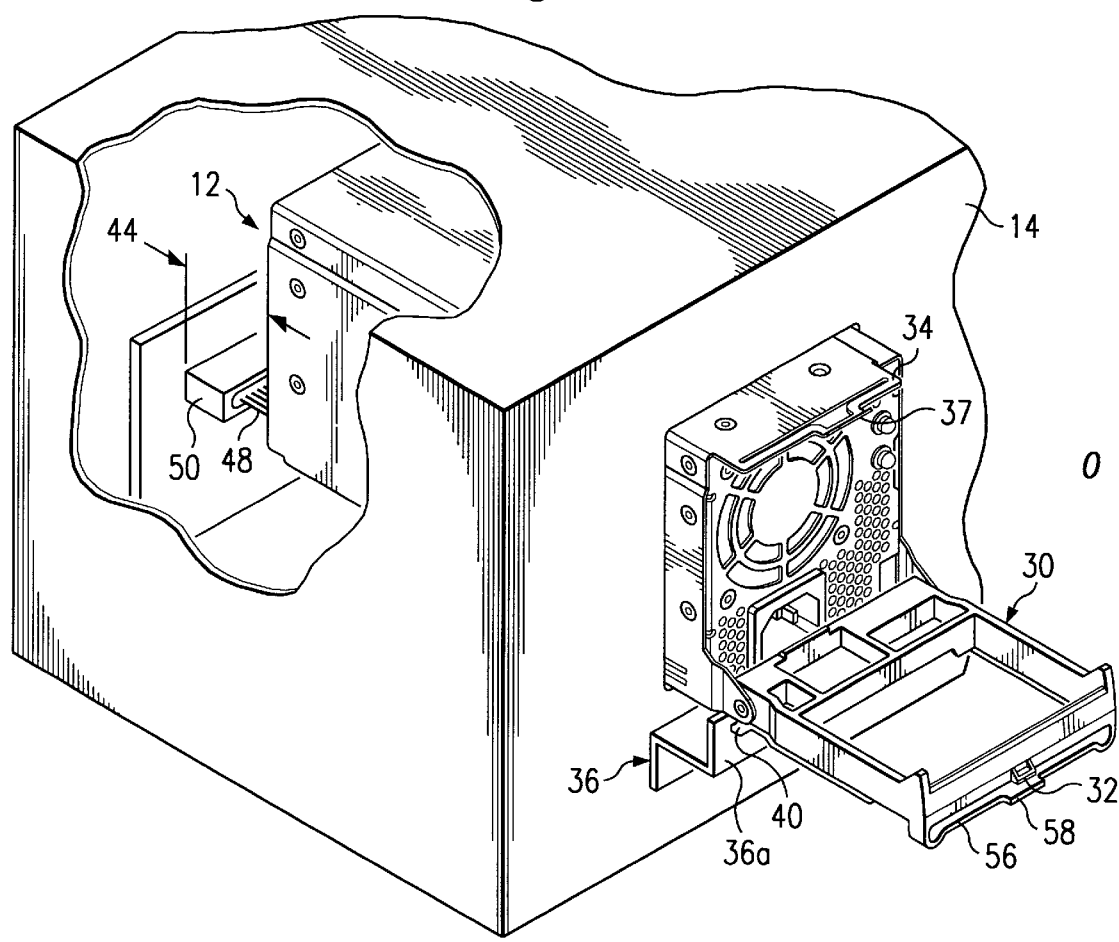
Figure 4A:
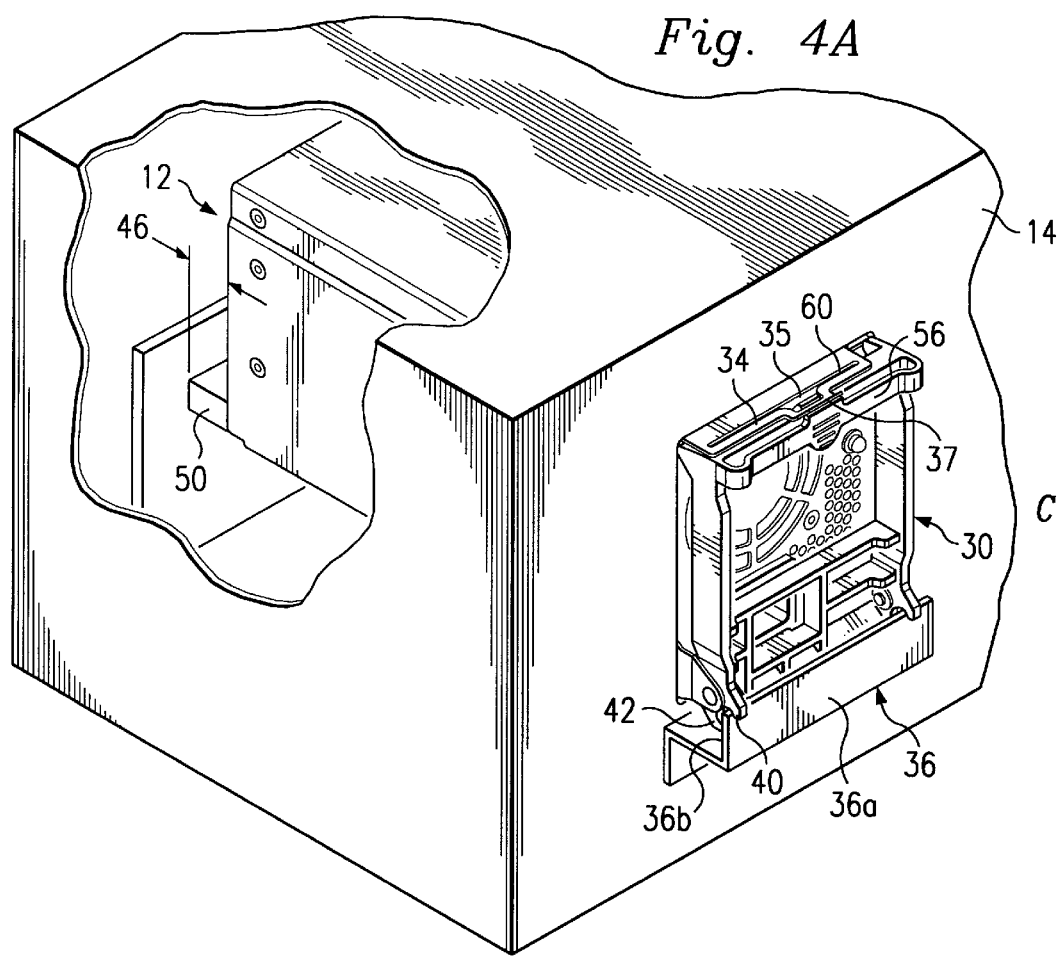
FIGS. 4A and 4B are fragmentary perspective views illustrating an embodiment of a latching assembly in combination with a power supply, the handle of the latching assembly being in the closed position.
Figure 5:
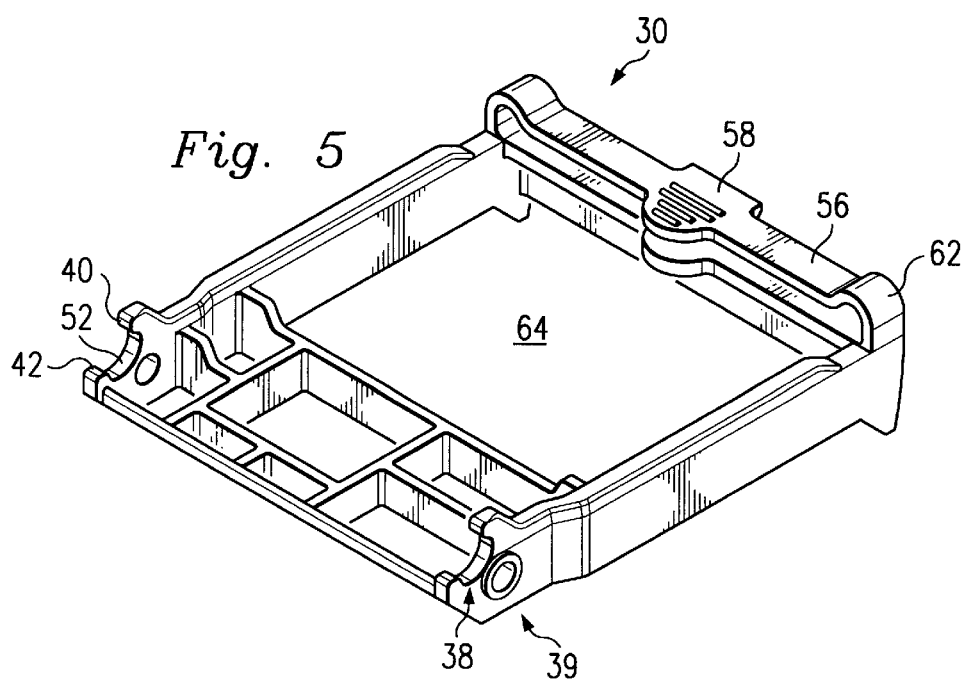
FIG. 5 is a perspective view illustrating an embodiment of a handle.

Now referring to FIGS. 3A–6, an illustrative embodiment of a component 12 having an attached latch assembly is shown. A handle 30 includes at least one retaining member 38 at a first end 39 thereof, see FIG 5. A retaining bracket 36 is attached to the chassis 14 and engaged by a pair of the retaining members 38, FIG. 6. As best shown in FIG. 5, each retaining member 38 includes a first protrusion 40 and a second protrusion 42. The retaining bracket 36, FIG. 3A has a first surface 36a that is engaged by the first protrusions 40 of each retaining member 38 and a second surface 36b, FIG. 4A that is engaged by the second protrusion 42 of each retaining member 38.

The handle 30 is movable between an open position O, FIG. 3A, and a closed position C, FIG. 4A. The handle 30, FIG. 3A, is pivotably attached to the component 12 and includes a catch 32 that is engaged by a resilient member 34 to hold the handle 30 in the closed position C. The catch 32 is captured in an opening 35, FIGS. 3A and 4A, of the resilient member 34 such that the handle 30 is maintained in the closed position C.

In a preferred embodiment, the handle 30 is made of plastic and the retaining bracket 36 and the resilient member 34 are made of metal. In alternate embodiments, the handle 30 may be made of other materials such as metal. The handle 30 may be pivotably attached to the component 12 using rivets 13, FIG. 3A, threaded fasteners or other know techniques.

The component 12, is inserted into the chassis 14 with the handle 30 in the open position. The first protrusion 40 of each retaining member 38 engages against the first surface 36a of the retaining bracket 36. This limits the component 12 from being inserted past a first insertion depth 44, FIG. 3A. The movement of the handle 30 between the open and closed position engages the second protrusion 42 of each retaining member 38 against the second surface 36b of the retaining bracket 36. This action displaces the component 12 to a second insertion depth 46, FIG. 4A.

The dual depth insertion process reduces the potential for damage or accelerated wear of the card edge 48, FIG. 3A, and card edge connector 50. In the preferred embodiments, the first insertion depth 44 is specified such that the card edge 48 and the card edge connector 50 do not contact each other. The card edge 48 and the card edge connector 50 are brought into contact by the controlled application of force on the apparatus as the handle 30 is moved from the open position O to the closed position C.

The geometry of the retaining member 38, FIGS. 3A–4A, will determine the distance between the first and second insertion depths 44, 46. The distance between the first and second insertions depths 44, 46 is proportional to the distance between the first and second protrusions 40, 42. For a handle with a constant pivot location, as the distance between the first and second protrusions 40, 42 increases, so will the distance between the first and second insertion depths 44, 46.

Figure 4B:
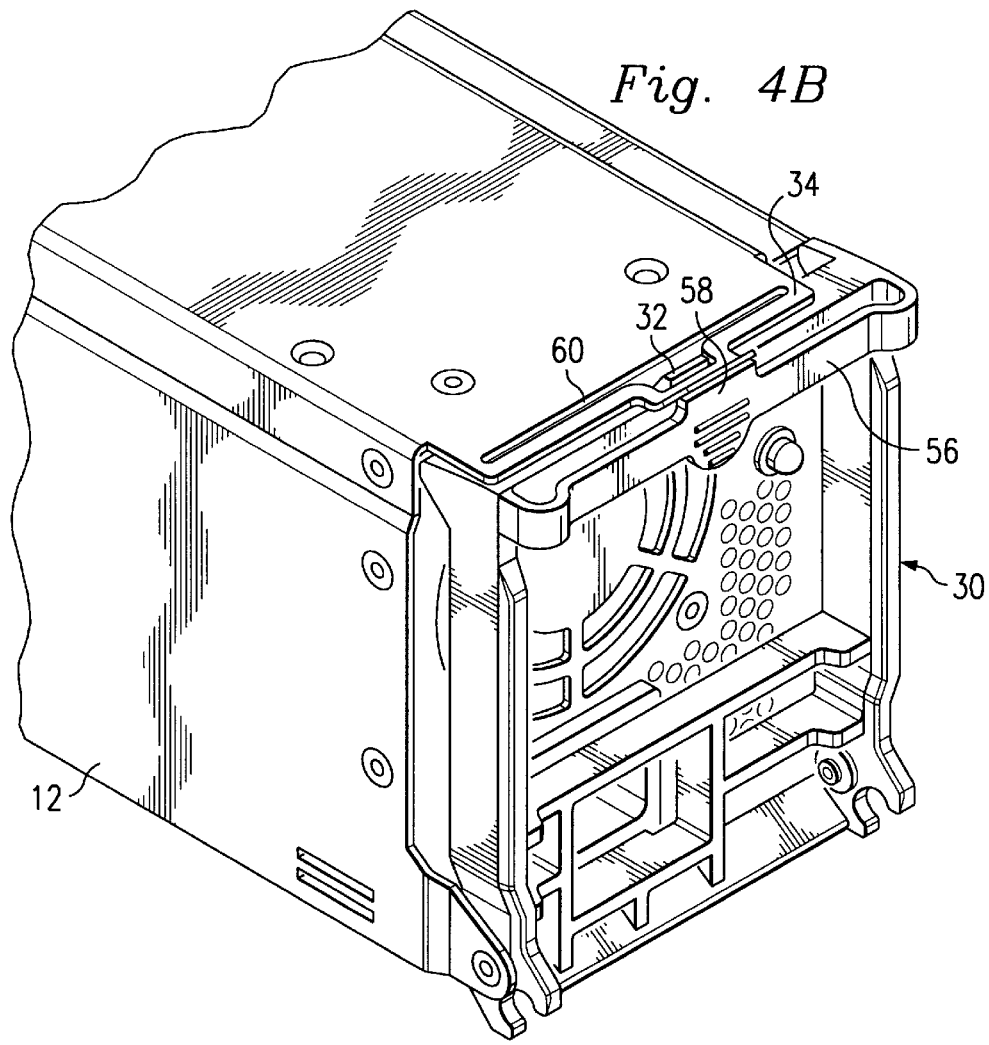

Referring now to FIG. 4B, the catch 32 may be disengaged from the resilient member 34 by moving the release member 56 towards the resilient member 34 until the release flange 58 engages and deflects the resilient member 34. The resilient member 34 may include an upturned tongue portion 37, O, see also FIG. 3B, for reducing binding between the release flange 58 and the resilient member. The deflection of the resilient member 34 releases the catch 32 from the opening 35. Once the catch 32 is released, the handle 30 may be moved to the open position O, FIG. 3A. The movement of the handle 30 to the open position O engages the first protrusion 40 of each retaining member 38 against the first surface 36a of the retaining bracket 36. This action displaces the component 12 to the first insertion depth 44. The component 12 may now be pulled from the chassis 14, if necessary.

Figure 6:
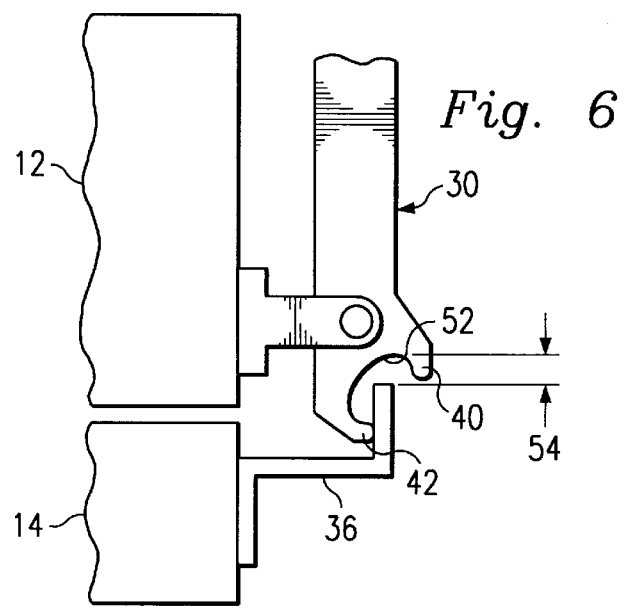
FIG. 6 is a fragmentary side view illustrating an embodiment of the retaining member.

As best shown in FIGS. 5–6, a recess 52 is formed between the first and second protrusions 40, 42. The shape of the recess 52 is preferably arcuate to minimize the stress concentrations at the regions where the protrusions 40, 42 and the recess 52 meet. More specifically, the arcuate shape is preferably an oval or a portion thereof. The recess 52 is configured to provide a clearance 54 between the recessed portion of the retaining member 38 during movement of the handle 30 between the open and closed positions. The clearance 54 precludes any binding and abrasion between the handle 30 and the retaining bracket 36 so that the handle 30 moves smoothly and with less applied force than previous techniques. This efficient feature enables the components to be made from less costly materials with simple and reduced manufacturing steps.

The resilient member 34 and the release member 56 require a degree of resiliency to perform their intended functions. Equally important is that the resiliency of the resilient member 34 and the release member 56 survive repeated flexing. As best shown in FIGS. 4B and 4B, a relief 60 may be formed to provide the resilient member 34 with suitable resiliency. The geometry of the relief 60 as well as the type and thickness of the material the relief 60 is formed through will determine the specific flexural characteristics of the resilient member 34. As best shown in FIG. 5, release member 56 may include one or more flex members 62. The flex members 62 enable the release member 56 to deflect without over-stressing the material.

The design of the handle 30 must also take into account the air flow requirements of the removable component 12. It is preferred that the handle 30 have a passage 64 of a sufficient size to adequately support airflow through the removable component 12. In addition to the size of the passage 64 in the handle 30, the presence of obstructions formed in the opening must also be considered. In the presence of significant obstructions formed in the passage 64, the power supply may fail due to overheating or operate at less than optimum conditions.

In one embodiment, FIG. 1 the handle 30 has an opening 64 formed therein and the removable component includes a fan vent 15. The opening 64 in the handle 30 and the airflow vent 15 are capable of supporting approximately the same rate of airflow. The opening 64 preferably has an area approximately the same as the area of the fan vent 15 and the opening is adjacent the fan vent.

In operation, the embodiments disclosed herein provide an apparatus for securing a handle in a closed position. The handle is capable of being moved between an open and a closed position. The handle includes a catch that is fixedly engaged by a resilient member to retain the handle in the closed position. A release member is attached to the handle for releasing the resilient member from the catch. The release member is movable from a first position to a second position to deflect the resilient member whereby the resilient member is disengaged from the catch to permit the handle to be moved to the open position.

As a result, one embodiment provides an apparatus for securing a removable component to a computer system. A handle is coupled to the removable component and is movable to an open position and to a closed position. A catch is formed on the L0 handle. A resilient member is coupled to be engaged by the catch to retain the handle in the closed position. A release member is coupled to the handle. The release member is movable to deflect the resilient member whereby the resilient member is disengaged from the catch to permit the handle to be moved to the open position.

In another embodiment, a latch assembly includes a resilient member and a handle capable of being moved to an open position and to a closed position. A catch is formed on the handle. The catch is engaged by the resilient member to retain the handle in the closed position. A release member is coupled to the handle. The release member is movable to deflect the resilient member whereby the resilient member is disengaged from the catch to permit the handle to be moved to the open position.

In yet another embodiment, a computer system includes a microprocessor, a system memory coupled to the microprocessor, a bus coupled to the microprocessor, an input device coupled to the bus, a removable component coupled to the microprocessor and an apparatus for securing the removable component to the computer system. The apparatus includes a handle coupled to the removable component. The handle is movable to an open position and to a closed position. A catch is formed on the handle. A resilient member is coupled to be engaged by the catch to retain the handle in the closed position. A release member is coupled to the handle. The release member is movable to deflect the resilient member whereby the resilient member is disengaged from the catch to permit the handle to be moved to the open position.

A further embodiment includes a method for mounting and removing a component for a computer system. The method includes the steps of connecting a handle and a release member to the component, the handle including a catch and being movable to an open position and a closed position; connecting a resilient member to the computer system, the resilient member being adjacent the catch when the handle is in the closed position; inserting the removable component into the computer system with the handle in the open position and the release member in a first position; and moving the handle to the closed position whereby the catch is engaged by the resilient member to retain the handle in the closed position.

As it can be seen, the illustrative embodiments presented herein provide several advantages. The apparatus provides for a handle that exhibits reduced airflow restriction through a removable component in a computer system. The reduction in the airflow restriction allows the removable component to be cooled more effectively and efficiently. Reduced space is required for hand manipulation of the apparatus. The removable component that has the handle attached to it and any adjacent removable components can be more easily inserted and extracted from the computer system. Furthermore, the reduced space requirement allows the removable components in the computer system to be positioned more closely together.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. An apparatus for securing a removable component in a computer system chassis comprising:

a handle connected to the removable component, the handle being movable to an open position and a closed position;

a catch provided on the handle;

a resilient member connected to the chassis for engagement with the catch to retain the handle in the closed position;

a release member connected to the handle, the release member being movable to deflect the resilient member so that the resilient member is disengaged from the catch to permit the handle to be moved to the open position; and at least one flex member connected to the release member to provide for resilient movement of the release member.

2. The apparatus of claim 1 wherein the resilient member is attached to the chassis.

3. The apparatus of claim 1 wherein the resilient member is attached to the removable component.

4. The apparatus of claim 1 wherein the resilient member includes an opening for receiving the catch.

5. The apparatus of claim 1 wherein the resilient member includes a relief formed therein.

6. The apparatus of claim 1 wherein the flex member and the release member are integral with the handle.

7. The apparatus of claim 1 wherein the release member further includes an upturned tongue portion adjacent the opening and wherein the release member further includes a release flange, the tongue portion being engaged by the release flange to deflect the resilient member in response to the release member being moved to a release position.

8. The apparatus of claim 1 wherein the handle is pivotably attached to the removable component.

9. The apparatus of claim 1 wherein the handle has an opening formed therein and wherein the removable component includes a fan vent capable of supporting a prescribed rate of airflow, the opening being capable of supporting approximately the same prescribed rate of airflow as the fan vent.

10. The apparatus of claim 1 wherein the fan vent has a prescribed area and wherein the opening has an area at least equal to the prescribed area of the fan vent.

11. The apparatus of claim 10 wherein the opening is adjacent the fan vent.

12. The apparatus of claim 6 wherein the handle is formed of a polymeric material.

13. The apparatus of claim 8 wherein the handle is pivotably attached to the removable component at a first end thereof and the release member is connected to the handle at an opposing end of the handle.

14. A computer system comprising:

a chassis;

a microprocessor mounted in the chassis;

an input coupled to provide input to the microprocessor;

a mass storage coupled to the microprocessor;

a video controller coupled to the microprocessor;

a memory coupled provide storage to facilitate execution of computer programs by the microprocessor;

a handle connected to secure a removable component in the chassis, the handle being movable to an open position and a closed position;

a catch formed on the handle;

a resilient member for engagement with the catch to retain the handle in the closed position;

a release member connected to the handle, the release member being movable to deflect the resilient member, whereby the resilient member is disengaged from the catch to permit the handle to be moved to the open position; and at least one flex member connected to the release member to provide for resilient movement of the release member.

15. The apparatus of claim 14 wherein the resilient member is attached to the chassis.

16. The apparatus of claim 14 wherein the resilient member is attached to the removable component.

17. The computer system of claim 14 wherein the resilient member includes an opening for receiving the catch.

18. The computer system of claim 14 wherein the resilient member includes a relief formed therein.

19. The computer system of claim 14 wherein the flex member and the release member are integral with the handle.

20. The computer system of claim 14 wherein the release member further includes an upturned tongue portion adjacent the opening and wherein the release member further includes a release flange, the tongue portion being engaged by the release flange to deflect the resilient member in response to the release member being moved to a release position.

21. The computer system of claim 14 wherein the handle is pivotably attached to the removable component.

22. The computer system of claim 14 wherein the handle has an opening formed therein and wherein the removable component includes a fan vent capable of supporting a prescribed rate of airflow, the opening being capable of supporting approximately the same prescribed airflow as the fan vent.

23. The computer system of claim 14 wherein the fan vent has a prescribed area and wherein the opening has an area at least equal to the prescribed area of the fan vent.

24. The computer system of claim 19 wherein the handle is formed of a polymeric material.

25. The computer system of claim 21 wherein the handle is pivotably attached to the removable component at a first end thereof and the release member is connected to the handle at an opposing end of the handle.

26. The computer system of claim 23 wherein the opening is adjacent the fan vent.

27. A latch for securing a removable component in a computer chassis comprising:

a resilient member connected to the chassis;

a handle connected to the component and movable to an open position and a closed position;

a catch formed on the handle, the catch being engaged by the resilient member to retain the handle in the closed position;

a release member connected to the handle, the release member being movable to deflect the resilient member so that the resilient member is disengaged from the catch to permit the handle to be moved to the open position; and at least one flex member connected to the release member to provide for resilient movement of the release member.

28. A method for mounting and removing a computer system component, the method comprising the steps of:

connecting a handle and a release member to the component, the handle including a catch and being movable to an open position and a closed position;

connecting a resilient member to the computer system, the resilient member being engaged with the catch when the handle is in the closed position;

connecting a flex member to the release member to provide for resilient movement of the release member to release the catch from the resilient member;

inserting the removable component into the computer system with the handle in the open position; and moving the handle to the closed position so that the catch is engaged by the resilient member to retain the handle in the closed position.

* * * * *